United States Patent [19]

Sun et al.

[11] Patent Number: 4,967,169

[45] Date of Patent: Oct. 30, 1990

[54] FET MONOLITHIC MICROWAVE INTEGRATED CIRCUIT VARIABLE SLOPE GAIN-EQUALIZER

[75] Inventors: Horng-Jye Sun, Fremont; Bruce C. Morley, Cupertino, both of Calif.

[73] Assignee: Teledyne MEC, Mountain View, Calif.

[21] Appl. No.: 388,094

[22] Filed: Jul. 31, 1989

[51] Int. Cl.⁵ .................................................. H03H 11/06
[52] U.S. Cl. ...................................... 333/28 R; 333/171
[58] Field of Search .................................. 333/28 R, 171

[56] References Cited

U.S. PATENT DOCUMENTS 2,718,622 9/1955 Harkless .............................. 333/28 R
4,035,747 7/1977 Hindermayr et al. ............. 333/28 R

FOREIGN PATENT DOCUMENTS 760555 10/1956 United Kingdom .............. 333/28 R

*Primary Examiner*—Paul Gensler
*Attorney, Agent, or Firm*—Townsend and Townsend

[57] ABSTRACT

A MMIC variable slope gain-equalizer varies the conductance of depletion mode Schottky gate FETs to controllably insert frequency dependent resonant members in a modified bridged-T configuration. Resistors connected from circuit input port to output port define the arms of the "T" and a T-node to which a first frequency dependent resonant member is connected in series with a first FET. A second FET and a second frequency dependent resonant member are each connected in series between the circuit ports, bridging the T. Preferably a third frequency dependent resonant member is series connected with the second frequency dependent member. Each frequency dependent resonant member resonates at about the highest frequency of interest, typically about 18 GHz. When the first FET is on and the second FET off, maximum attenuation at lower frequencies is inserted into the circuit, and when the first FET is off and the second FET on, minimum attenuation is inserted at lower frequencies. Intermediate levels of FET conductivity produce intermediate levels of frequency dependent attenuation. In a first embodiment, FET conductivity is controlled by two push-pull control voltages. A second embodiment uses a single control voltage to vary conductivity. The first embodiment operates at about 0–18 GHz, while the second embodiment operates at about 2–18 GHz. Each embodiment realizes a variable slope gain-versus frequency temperature function of between about −0.6 dB/GHz to about +0.2 dB/GHz with a 0 to +3VDC control voltage change.

23 Claims, 6 Drawing Sheets

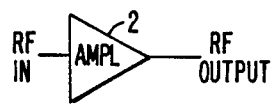
FIG._1A.
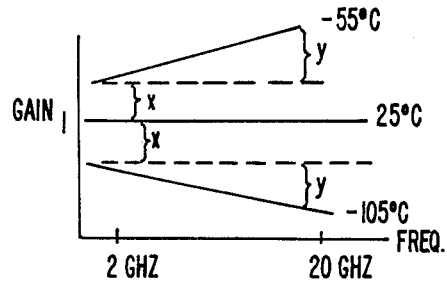
FIG._1B.
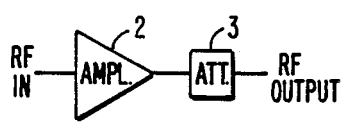
FIG._1C.
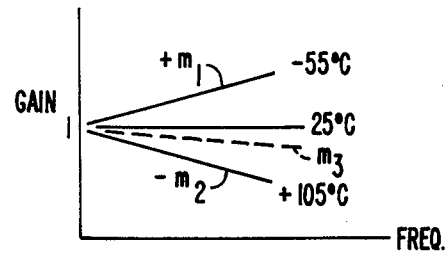
FIG._1D.
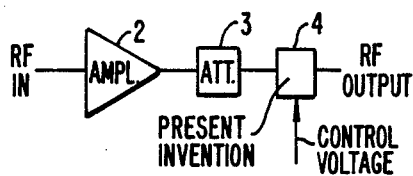
FIG._1E.
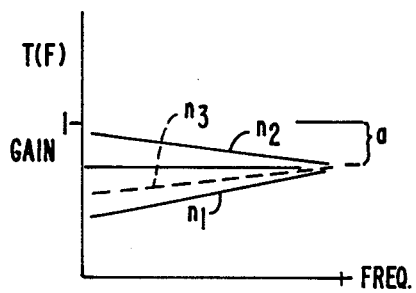
FIG._1F.
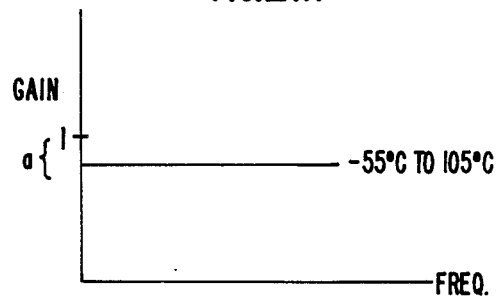
FIG._1G.

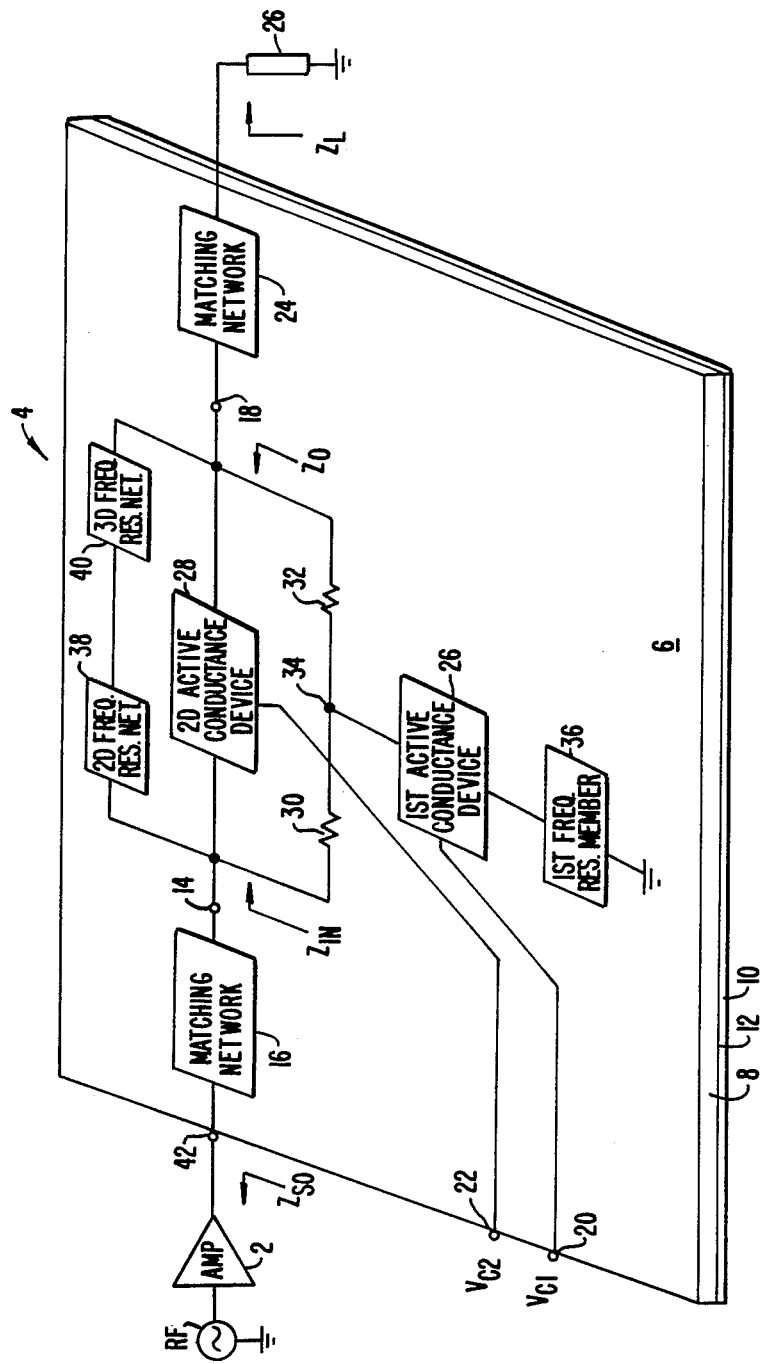
FIG._2.

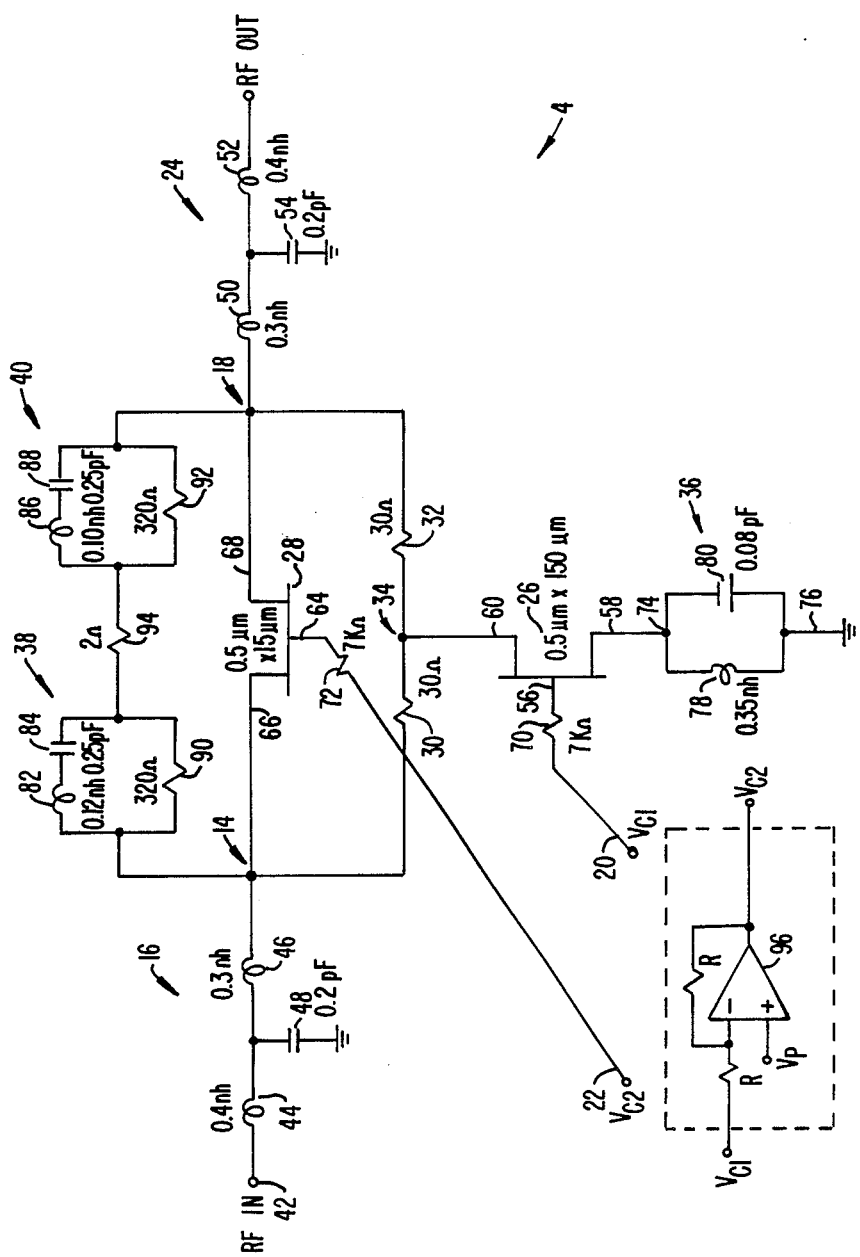
FIG._3.

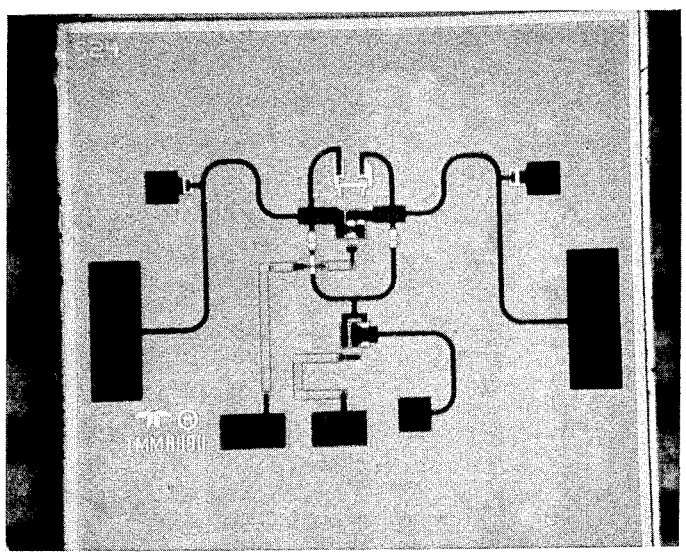
FIG._4.
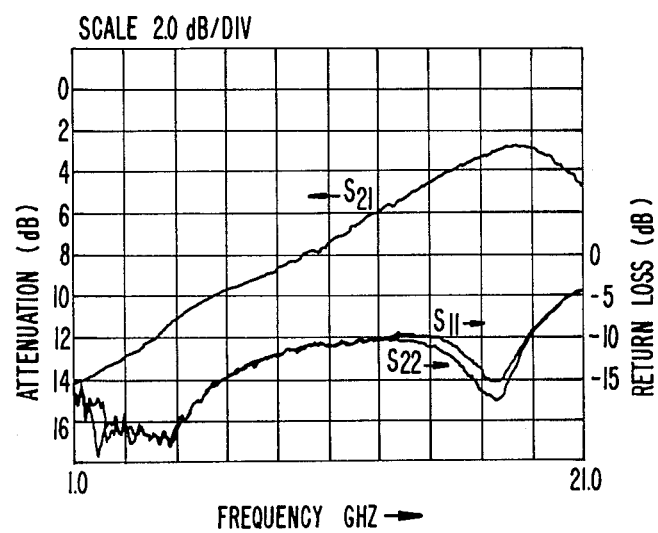
FIG._5.
$V_{C2} = -2.6V$
$V_{C1} = -0.4V$

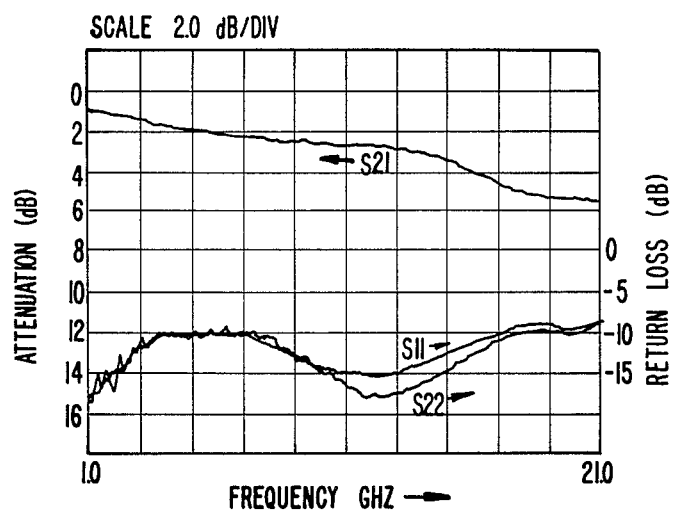
FIG._6.
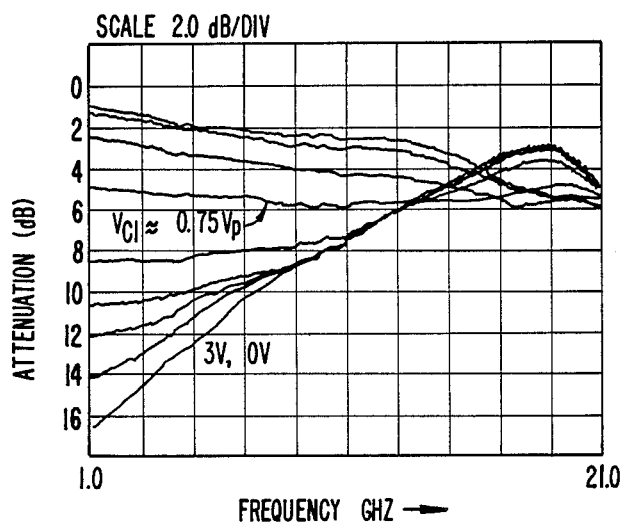
FIG._7.

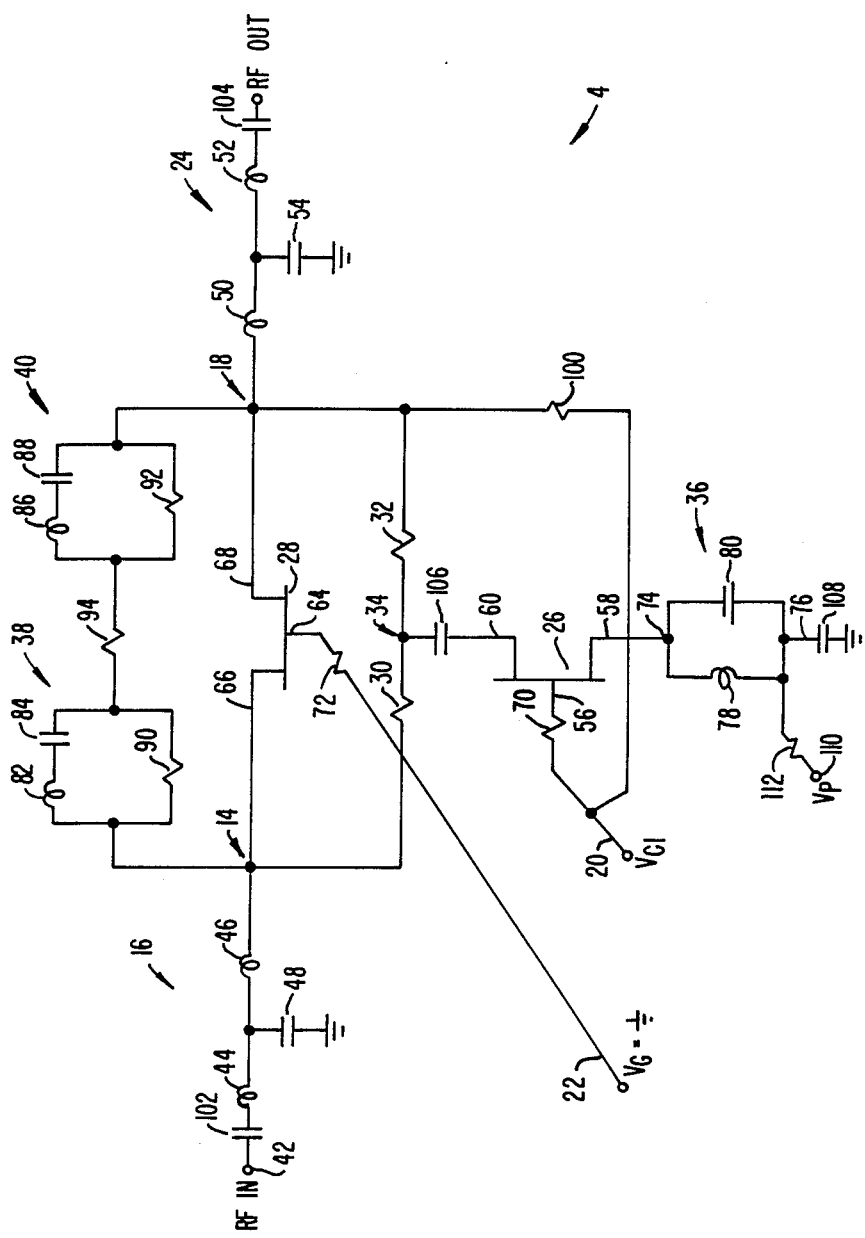
FIG._8.

FET MONOLITHIC MICROWAVE INTEGRATED CIRCUIT VARIABLE SLOPE GAIN-EQUALIZER

BACKGROUND OF THE INVENTION

This invention relates to microwave frequency gain-equalizers, and more particularly to a monolithic microwave integrated circuit (MMIC) variable slope gain-equalizer incorporated into a microstrip transmission line system.

The use of a microstripline waveguide formed as part of an MMIC in a microwave system that includes a microwave amplifier is known in the art. The nominal gain versus frequency characteristic of such an amplifier in a microwave system generally has a component that is independent of frequency but temperature dependent, and a component that is both temperature and frequency dependent. Typically the slope of the gain versus-frequency temperature dependent characteristic (the "gain slope") of such an amplifier becomes more positive with decreasing temperature, and more negative with increasing temperature.

It is known in the art to use an attenuator that is frequency independent to compensate for the gain versus frequency temperature changes that are frequency independent. However such an attenuator does not compensate for an amplifier's frequency dependent gain changes over temperature. It is desirable, therefor, to compensate for temperature dependent gain slope changes by inserting a circuit following the amplifier to equalize the gain-versus-frequency temperature characteristics of the amplifier. In a system capable of about 0 to 30 dB gain, such a circuit should exhibit a variable slope gain-versus-frequency transfer function, preferably over a range of about −0.6 dB/GHz to about +0.2 dB/GHz. Linearity should be within about 0.5 dB over a DC to 18 GHz range, and the voltage standing wave ratio (VSWR) at the input and output ports of the circuit should be 2:1 or less.

Applicant is not aware of any circuits exhibiting such characteristics in the prior art.

SUMMARY OF THE INVENTION

The present invention provides a Schottky gate field effect transistor (MESFET) variable slope gain-equalizer circuit that is integrated into the, typically GaAs semi-insulating substrate of a monolithic microwave integrated (MMIC) microstripline. A metallized ground plane is deposited on one surface of the substrate and the MMIC FET variable slope gain-equalizer circuit including the microstripline is fabricated on the other surface.

A first embodiment of the present invention includes an RF circuit input port to which an input signal to be controllably attenuated as a function of frequency is connected, an RF circuit output port from which an attenuated fraction of the input signal is delivered to a load, and first and second control ports for receiving first and second control voltages Vc1, Vc2, whose magnitudes vary the gain-versus-frequency slope characteristics of the circuit.

First and second variable conductance active devices are connected in a modified bridged-T configuration between the RF circuit input and output ports. A pair of series-connected frequency independent attenuator elements (preferably resistors) form the top of the "T" and are connected between the RF circuit input and output ports, and define a "T-node" at their junction. The first variable conductance active device is connected between the T-node and a first lead of a first frequency dependent resonant member whose second lead is connected to signal ground. The first member is essentially a band pass filter for shunting to ground signals at the T-node having frequencies substantially below the resonant frequency of the first member. The second variable conductance active device is connected in series between the RF circuit input and output ports, bridging the top of the "T". A second frequency dependent resonant member is connected between the RF input and output ports, in parallel with the second variable conductance active device. The second member is essentially a band pass filter for shunting from the input port to the output port signals having a frequency substantially near the resonant frequency of the second member, and for attenuating lower frequencies. Preferably a third frequency dependent resonant member is connected in series with the second frequency dependent resonant member, both series-connected members being in parallel with the second variable conductance active device. Preferably the impedance of each frequency dependent resonant member is characterized by two poles, although more complex members may be used also. The resonant frequency of each frequency dependent resonant member is preferably about equal to $f_h$, the highest frequency of interest (about 18 GHz).

In this first embodiment, the control voltages are provided in a "push-pull" relationship to one another to the gate or control leads of the variable conductance active devices. What is meant by "push-pull" is that as Vc1 varies from say 0 V to a level Vp, Vc2 varies from Vp to 0 V. Varying the magnitude of Vc1 and Vc2 causes the conductance of the active devices to vary oppositely to one another; that is, as the first active device becomes more conductive, the second active device becomes less conductive. Preferably each active device is an depletion mode metal or Schottky gate MESFET or FET, having a pinch-off voltage Vp of about 3 V.

When $|Vc1| << |Vp|$, the first FET turns on and whatever portion of the RF input signal from the RF input port is present at the T-node is presented to the first frequency dependent resonant member. Frequency components of the RF input signal that are relatively far from the resonant frequency of the first frequency dependent resonant member (i.e., $f << f_h$) will be shunted to signal ground through the first frequency dependent resonant member, while higher frequencies close to $f_h$ will not pass through the first member. Thus, when the first FET is on, the circuit will cause greater attenuation at lower frequencies.

Because the control signals are in push-pull relationship, when $|Vc1| << |Vp|$, $|Vc2| \approx |Vp|$. Therefor when the first FET is turned on, the second FET is turned off. With the second FET off, the second and third (if there is a third) frequency dependent resonant members will attenuate signals at the RF input port as a function of frequency. Since the resonant frequency of the second and third (if there is a third) frequency dependent resonant members is about $f_h$, when the second FET is off, relatively low frequency components of the RF input signal will be attenuated by the resonant members, whereas frequencies close to $f_h$ will pass through and be relatively unattenuated. Thus, when the second FET is off the circuit will cause greater attenuation at lower frequencies.

Conversely, when $|Vc1| \approx |Vp|$ and when $|Vc2| << |Vp|$, the first FET will be off and the second FET will be on. When the first FET is off, the first frequency dependent resonant member is essentially removed from the circuit and will no longer contribute increased low frequency attenuation to the circuit. When the second FET is on, the second FET essentially connects in the RF input and output ports together, shunting the contribution of the second and third frequency dependent resonant members. As a result, the increased low frequency attenuation contributed by the second and third frequency dependent resonant members will no longer be in the circuit.

Thus, by turning the FETs on, off, or somewhere in between, the amount of frequency-dependent attenuation introduced by the circuit is controlled as a function of the control voltages Vc1, Vc2. Further, by making the resonant frequencies of each frequency dependent resonant member about equal to the highest frequency of interest $f_h$, but slightly different from one another, the transfer function of the circuit can be made more linear. It can be shown that the transfer function of the circuit is approximately:

$$T(f) = 1 - \frac{[f - \omega 2] \times [f - \omega 3]}{[f - \omega 1]}$$

where $\omega 1$, $\omega 2$, $\omega 3$ vary as a function of the control voltages Vc1, Vc2 and are proportional respectively to the resonant frequencies of the first, second and third frequency dependent resonant members, and where the RF input frequency is f. It is seen that the maximum value of the transfer function is $T(f)=1$ (i.e., no attenuation), and the minimum value is $T(f)=0$ (i.e., maximum attenuation). Thus, the attenuation fraction of the RF input signal present at the RF circuit input port that reaches the RF circuit output port can be made to vary, ideally, from 0 to 1 by varying the control voltages Vc1, Vc2.

In practice, the slope of the transfer function is typically variable between about +0.22 dB/GHz (Vc1=Vp, Vc2=0), and about −0.67 dB/GHz (Vc1=0, Vc2=Vp). Preferably a fixed amount of insertion loss is maintained at $f_h$ and the insertion loss at lower frequencies is varied up or down relative to the fixed loss. The point of fixed insertion loss at $f_h$ acts almost like a fulcrum for the variable slopes provided on the T(f) transfer function. Providing a fixed insertion loss at $f_h$ advantageously allows the present invention to provide a positive or negative transfer function, without incorporating a gain stage. When Vc1$\approx$0.75 Vp, the slope is about zero, i.e., no frequency-dependent attenuation.

A second embodiment operates substantially as above described, except that a single control voltage Vc1 is applied to the control or gate of the first variable conductance active device, and to the output lead of the second variable conductance active device on the RF output port side of the device. The control or gate lead of the second variable conductance active device is connected to a reference level, typically ground. DC blocking capacitors are included in series with the RF input port, the RF output port, between the T-node and the output lead of the first variable conductance active device, and between ground and the second lead of the first frequency dependent resonant member. These capacitors isolate DC from the variable conductance active devices. The second lead of the first member is connected to a reference voltage Vp which is substantially equal to the pinch-off voltage of the FETs. So configured, when Vc1$\approx$Vp, the first FET is on and the second FET is off, and when Vc1$\approx$OV, the first FET is off and the second FET is on. At intermediate levels of Vc1, the FETs are at intermediate levels of conductivity. Thus the variable gain slope characteristic is achieved with the single control voltage Vc1, which typically varies between zero and about +3 V (where the FET pinch-off voltage is about 3 V). The transfer function T(f) remains the same except that $\omega 1$, $\omega 2$, $\omega 3$ vary as a function of the single control voltage Vc1 and are proportional respectively to the resonant frequencies of the first, a second and third members. However, the presence of the DC blocking capacitors restricts operation of this embodiment to frequencies between about 2-18 GHz.

In the various embodiments, an impedance matching network is preferably included between the RF input port and the source of the microwave signals (typically a microwave amplifier), and between the RF output port and the load presented to the circuit. These matching networks enable the circuit to have an input and output impedance of about 50$\Omega$, typically the impedances of the signal source and load seen by the circuit.

It is an objective of the present invention to provide an MMIC variable slope gain-equalizer whose transfer function has a slope that varies between about +0.22 dB/GHz and about −0.67 dB/GHz, with a linearity within about ±0.5 dB.

It is a further objective of the present invention to vary the gain slope of such an MMIC as a function of two "push-pull" control voltages over a frequency range from DC to about 18 GHz, or as a function of a single control voltage over a frequency range of about 2 GHz to about 18 GHz.

It is a still further objective of the present invention to maintain input and output VSWRs less than about 2:1 over the frequency range of interest.

Other features and advantages of the invention will appear from the following figures and from the following description, wherein a preferred embodiment is set forth in detail.

BRIEF DESCRIPTION OF THE DRAWINGS

FIGS. 1(A)–(G) demonstrate the gain-slope characteristics of an amplifier with and without the present invention;

FIG. 2 is a block diagram showing the elements of a variable slope gain-equalizer according to a first embodiment of the present invention;

FIG. 3 is a schematic of a variable slope gain-equalizer according to a first embodiment of the present invention;

FIG. 4 is a plan view of an MMIC chip realization of the schematic of FIG. 3;

FIGS. 5-7 show operating characteristics of the present invention as shown in FIG. 3;

FIG. 8 is a schematic of an alternative embodiment of the present invention.

DETAILED DESCRIPTION OF THE PREFERRED EMBODIMENTS

FIGS. 1(A) and 1(B) show a microwave amplifier 2 and the gain-versus-frequency RF output of amplifier 2 over a frequency range of about 0 to 18 GHz and over a temperature range of about −55° C. to +105° C. FIG.

1(B) shows that the gain-versus-frequency characteristic (the "gain slope") of amplifier 2 varies with temperature and with the frequency of the RF input signal. With reference to FIG. 1(B), the gain slope has two components, x and y. Component x is temperature dependent but frequency independent, whereas component y is temperature and frequency dependent. As seen by FIG. 1(B). the gain slope of amplifier 2 typically increases with decreasing temperature, and decreases with increasing temperature.

As shown in FIGS. 1(C) and 1(D), it is known in the art to follow amplifier 2 with a temperature dependent frequency independent attenuator 3. Attenuator 3 may be adjusted to compensate for the effects of component x, with the result that the gain-slope of amplifier 2 varies substantially linearly as a function of frequency and temperature. As shown in FIG. 1(D), the resultant slope may vary anywhere between +m1 and −m2. Applicant's co-pending application for a FET MONOLITHIC MICROWAVE INTEGRATED CIRCUIT VARIABLE ATTENUATOR, Ser. No. 07/329,625, filed Mar. 28, 1989, now U.S. Pat. No. 4,890,077, discloses an attenuator 3 capable of compensating for the frequency independent gain slope components of amplifier 2. Applicant refers to and incorporates by reference said co-pending application.

FIGS. 1(E)-1(G) demonstrate the improvement to the configuration of FIG. 1(C) if a variable slope gain-equalizer 4, the present invention, is added to a microwave system. FIG. 1(F) shows the transfer function T(f) provided by variable slope gain-equalizer 4 as having a positive slope $n_1$, a negative slope $n_2$ or any slope in between (the slope being control voltage dependent). Note that according to the present invention, at the highest frequency of interest $f_h$ there is a fixed attenuation equal to a. Gain-equalizer 4 may be adjusted to compensate for the frequency and temperature dependent characteristics of amplifier 2. For example, if the slope of amplifier 2 in FIG. 1(D) is, say, $m_3$, all that is required in FIG. 1(E) is to adjust the transfer function T(f) of equalizer 4 (with a control voltage) to have a slope $n_3 = -m_3$, which will compensate amplifier 2 producing the characteristic shown in FIG. 1(G). The result, as shown in FIG. 1(G) is an amplifier (or system) characterized by a substantially flat gain-versus-frequency characteristic, regardless of frequency and/or temperature. It is not required that the present invention be used in conjunction with an attenuator 3; however, in such circumstance the output of amplifier 2 can vary, without compensation, over the range ±y.

FIG. 2 shows in block diagram form a microwave system that includes an amplifier 2 (or other source of RF signals) and a variable slope gain-equalizer MMIC 4 according to the present invention. Variable slope gain-equalizer 4 is constructed on a first surface 6 of a semi-insulating, typically GaAs, substrate 8, having a ground plane 10 formed by metallizing the entire area of opposing surface 12. FIG. 2 will be described in reference to the embodiment of FIG. 3, although as will be seen, FIG. 2 may be considered with slight modification generic to the embodiment of FIG. 8 as well.

An RF input signal to be attenuated as a function of frequency and temperature is connected to the circuit input port 14, which port has an input impedance Zin. Generally the RF input signal is the output signal from a microwave amplifier 2 or other signal source (not shown) having a source output impedance Zso of typically 50Ω. Preferably, a first matching network 16 matches Zin to Zso.

Circuit 4 permits a fraction (i.e., the attenuated portion) of the RF signal present at input port 14 to appear at the circuit output port 18. In the preferred embodiment of FIG. 3, the attenuation fraction varies as a function of first and second control voltages Vc1, Vc2 connected, respectively, to first and second control voltage ports 20, 22 and as a function of the frequency of the RF signal. Control signals Vc1, Vc2 are provided by a variable source (not shown in FIG. 2) in a "push-pull" relationship such that as Vc1 varies from 0 to Vp, Vc2 varies from Vp to 0. An alternative embodiment shown in FIG. 8 uses a single control voltage Vc1 connected to port 20 to control the attenuation fraction. Output port 18 has an output impedance of Zo and is preferably matched by a second matching network 24 to the input impedance Z1 of the load 26.

It is the function of the present invention to compensate for the frequency dependent gain-versus-frequency temperature characteristics of amplifier 2. In the embodiment of FIG. 3, as Vc1 and Vc2 are varied between about 0 and 3 V, the slope of the gain-versus-frequency transfer function of circuit 4 varies from about −0.67 dB/GHz to about +0.2 dB/GHz, over a frequency range of DC to about 18 GHz. In the alternative embodiment of FIG. 8, as the single control voltage Vc1 varies between about 0 and 3V, the slope of the gain-versus-frequency transfer function of circuit 4 varies over the same attenuation range as the embodiment of FIG. 3, although the lower frequency range is limited to about 2 GHz because the circuit includes DC blocking capacitors.

Circuit 4 includes a first active variable conductance device 26, a second variable conductance device 28, substantially equal magnitude first and second frequency independent attenuation elements 30 and 32 which elements define a "T-node" 34 at their junction, and first, second and third frequency dependent resonator members 36, 38 and 40.

In practice, active devices 26 and 28 are preferably depletion mode Schottky gate field effect transistors (FETs), each having a pinch-off voltage Vp of about 3 V. FETs 26, 28 may be fabricated with multiple gates as described in applicant's aforesaid co-pending application. Multiple gate FETs, so fabricated, exhibit increased power handling without substantial reduction in upper frequency characteristics. Attenuation elements 30, 32 are preferably equal value resistances connected between the circuit input and output ports 14, 18 to define the arms or top portion of a "T" configuration. FET 26 is connected between the T-node 34 and a first lead of the first resonator member 36, the second lead of resonator 36 being connected to signal ground. The second FET 28 and the second and third resonator members 38, 40 bridge the "T" formed by elements 30, 32, 26 and 36.

Each resonator member 36, 38, 40 is essentially a band pass filter resonating at about the highest frequency of interest, $f_h$, approximately 18 GHz. At lower frequencies, i.e., $f << f_h$, resonator member 36 approximates a short circuit, while resonator members 38 and 40 each approximate an open circuit. At frequencies approaching $f_h$, resonator member 36 approximates an open circuit, while resonator members 38 and 40 approximate a short circuit. Preferably the impedance of each resonator member 36, 38, 40 has a two pole characteristic. More complex resonator members having three or more poles may be used, but the circuit modeling becomes increasingly complex and any advantage gained by the more complex configuration is not easily fully utilized. Single pole resonator members will not work well insomuch as an approximate open circuit or short circuit condition cannot be realized.

When FET 26 is turned on in response to an appropriate level of Vc1 at port 20, FET 28 is turned off because Vc2 at port 22 is in push-pull relationship to Vc1. When FET 26 is on, the first resonator member 36 shunts to ground signals at node 34 whose frequency is substantially less than $f_h$. Simultaneously FET 28 is off, permitting resonator members 38 and 40 to attenuate signals at port 14 whose frequency is substantially less than $f_h$. Thus, when Vc1, Vc2 cause FET 26 to be on and FET 28 to be off, circuit 4 attenuates lower frequencies more than higher frequencies.

When Vc1, Vc2 cause FET 26 to be off and FET 28 to be on, resonator member 36 is essentially no longer in the circuit and does not introduce increasing attenuation at lower frequencies. Simultaneously, because FET 28 is on, signals at the input port 14 are shunted by FET 28 to the output port 18 without substantial frequency dependent attenuation from resonator members 38 and/or 40. The result is that signals at input port 14 pass through circuit 4 without substantial frequency dependent attenuation.

At intermediate levels of Vc1, Vc2, i.e., wherein FET 26 and FET 28 are both in an active region, various slopes of frequency-dependent attenuation are achieved by circuit 4. When Vc1 ≈ 0.75 Vp, for example, the attenuation slope of circuit 4 is approximately flat, i.e., frequency independent. Although one might expect that Vc1 ≈ Vp would produce a flat or zero slope transfer function, actual circuits include parasitic capacitance and inductance associated with the FETs and circuit elements. These parasitics introduce increased insertion loss at $f_h$ which results in a non-zero slope at Vc1 ≈ Vp. The present invention exploits this phenomenon advantageously by including the non-zero slope at Vc1 = Vp to enhance the available slope control range (i.e., instead of a slope control range of −0.67 dB/GHz to 0.0 dB/GHz, it now extends to −0.22 dB/GHz).

Circuit 4 exhibits substantially constant input and output impedances as seen at ports 14, 18 over the frequency range of interest. At relatively high frequencies (and without regard to control voltage levels Vc1, Vc2), resonator members 38, 40 substantially shunt ports 14, 18 together with the result that Zin at port 14 approximates the impedance of the load seen at port 18. Since circuit 4 is symmetrical, the output impedance at port 18 will approximate the load impedance seen at port 14. At relatively low frequencies, the impedance looking into port 14 or port 18 will include a contribution from FET 26 and FET 28. However, FET 26 and FET 28 essentially operate in push-pull such that when conductivity of one FET is increased, the conductivity of the other FET is decreased. Therefor it is intuitive that the input and output impedances of circuit 4 will tend to remain at some constant level even as the control voltages Vc1, Vc2 are varied. By judicious modeling of the FET parameters and component values, it is possible to arrive at the circuit of FIG. 3 having the component values shown. The circuit shown in FIG. 3 exhibits substantially constant input/output impedance over the frequency range of interest as shown by FIGS. 5 and 6.

The circuits of FIGS. 3 and 8 were arrived at using computer analyses and optimizations made with "SUPER-COMPACT" ® microwave simulation software produced by Compact Software of Paterson, N.J. Such software and its use in analyzing or synthesizing circuits is well known in the art, and the analysis will not be described in further detail. Applicant's aforesaid copending application sets forth additional information regarding design trade-offs and considerations as regards the selection of FETs and components in optimizing circuits.

Turning now to FIG. 3, a schematic of the first preferred embodiment is shown. It is to be understood that the circuit of FIG. 3 is fabricated on the first surface 6 of the substrate 8 shown in FIG. 2.

Comparing FIG. 3 with FIG. 2, it is seen that an RF input signal (from amplifier 2 or another source) connects to input terminal 42 of the first matching network 16. Network 16 includes inductors 44, 46 and capacitor 48 which are connected to form a "T" impedance matching network between the RF input signal T and the circuit input port 14. It is also seen that the second matching network 24 is a similar "T" impedance matching network including inductors 50, 52 and capacitor 54. As shown in FIG. 3, inductors 44 and 52 are each about 0.4 nH, inductors 46 and 50 are each about 0.3 nH, and capacitors 48 and 54 are each about 0.2 pF. Attenuation elements 30, 32 are preferably resistances of substantially equal value, about 30Ω, connected in series between input and output ports 14 and 18.

The first FET 26 includes a gate or control lead 56, a source or first output lead 58 and a drain or second output lead 60. Similarly, the second FET 28 includes a gate or control lead 64, a source or first output lead 66 and a drain or second output lead 68. FET 26 and FET 28 each have a gate length of 0.5 μm and a gate width of 150 μm. Gate 56 of FET 26 is connected through a resistance 70 (about 7 KΩ) to receive the first control voltage Vc1 at port 20, while gate 64 of FET 28 is connected through a resistance 72 (about 7 KΩ) to receive the second control voltage Vc2 at port 22. The source 66 of FET 28 is connected to input port 14, while the drain 68 is connected to output port 18, placing FET 28 in shunt between the input and output ports 14, 18.

Drain 60 of FET 26 connects to T-node 34, while source 58 connects to a first terminal 74 of first frequency dependent resonator member 36. The second terminal 76 of resonator member 36 is connected to ground. Frequency dependent resonator member 36 preferably includes a parallel connected inductance 78 and capacitance 80, selected to resonate at about $f_h$. In the preferred embodiments and as shown in FIG. 4, capacitance 80 is preferably fabricated as a quarter-wavelength transmission line having an equivalent capacitance of about 0.08 pF, while inductance 78 is about 0.35 nH. The resonant frequency of capacitance 80 and inductance 78 is about 18 GHz.

The second frequency dependent resonator member 38 preferably includes an inductance 82 connected in series with a capacitance 84, while the third frequency dependent resonator member 40 preferably includes an inductance 86 connected in series with a capacitance 88. Preferably inductance 82 is about 0.12 nH, inductance 86 is about 0.10 nH, and capacitances 84, 88 are each about 0.25 pF. The resonant frequency of the second and third members 38, 40 are each about equal to $f_h$, but preferably are intentionally slightly different one from the other. This slight intentional skewing of resonant frequencies permits improved linearity of the circuit transfer function. For ease of implementation, in the preferred embodiments, inductances 82 and 86 are each about one third the magnitude of inductance 78, while capacitances 84, 88 are each about three times the magnitude of capacitance 80. Resistances 90, 92 are connected in parallel across members 38, 40 to adjust the attenuation slope at low frequencies and to decrease the "Q" or sharpness of the series resonant circuits formed by inductance 82, capacitance 84, and inductance 86 and capacitance 88. Resistances 90, 92 are each about 320Ω. A resistance 94 (about 2Ω) is preferably connected in series between members 38 and 40 to further decrease the Q or sharpness of the combined members 38, 40. Resistances 90, 92, 94 improve the linearity of the overall transfer function of circuit 4. As above described, the impedance of each resonator member 36, 38, 40 is preferably characterized by two poles.

As shown in FIG. 3, a push-pull relationship between control voltages Vc1, Vc2 may be achieved with an operational amplifier 96 whose positive input is connected to a voltage substantially equal to |Vp|, the pinch-off voltage of FETs 26 and 28, typically about 3 V, and whose negative input is configured as a unity gain inverter, receiving Vc1 as an input. The output signal of such a configuration will be Vc2=Vp−Vc1, i.e., the desired push-pull relationship between Vc1 and Vc2.

As noted earlier, the transfer function of circuit 4 is approximated by:

$$T(f) = 1 - \frac{[f - \omega 2] \times [f - \omega 3]}{[f - \omega 1]}$$

where $$T(f) = S21 = \frac{\text{output voltage at port 18}}{\text{input voltage at port 14}}$$

and where ω1, ω2, ω3 vary as a function of the control voltages Vc1, Vc2 and are proportional respectively to the resonant frequencies of the first, second and third frequency dependent resonant members, and where the RF input frequency is f. As shown in FIGS. 2 and 3, although the first preferred embodiment uses two resonator members 38 and 40 to improve the linearity of the overall transfer function, the present invention will work if either of these members is omitted and replaced with a short circuit. In such circumstance, the small resistance 94 may also be omitted and replaced with a short circuit. The transfer function of the resultant circuit will exhibit a slight hump, however, near $f_h$.

FIG. 4 is a plan view of an MMIC implementing the preferred embodiment of FIG. 3. The dimensions of the chip in FIG. 4 are approximately 1.8 mm×1.1 mm.

As shown by FIG. 5, when Vc2→Vp (Vp=−3.OV) and Vc1→OV, the circuit exhibits about 14 dB attenuation at low frequencies and about 3 dB attenuation at $f_h$. The slope of the attenuation transfer function is about −0.67 dB/GHz and is linear within about 0.2 dB. FIG. 5 also shows the voltage reflection coefficients S11, S22 which are indicative of the VSWR of circuit 4. These coefficients are defined as:

$$S11 = \frac{\text{reflected voltage}}{\text{input voltage}}$$

$$S22 = \frac{\text{reflected voltage}}{\text{output voltage}}$$

Ideally S11=S22=0, which defines a perfect VSWR=1. The return loss of the circuit is given by 20 logS11 or 20 logS22, with the return loss being infinite in the ideal case.

FIG. 6 shows the characteristics of circuit 4 when Vc1→Vp and Vc2→OV, wherein the transfer function slope is about +0.2 dB/GHz. FIG. 7 shows the locus of transfer function slopes available at different combinations of Vc1, Vc2 voltages. It is seen that when Vc1≈0.75Vp, the slope of the transfer function is essentially flat. Thus, by varying Vc1, Vc2, the slope of the circuit can be set to anywhere between about −0.67 dB/GHz and +0.2 dB/GHz.

FIG. 8 shows an alternative embodiment wherein a single control voltage Vc1 is presented at control port 20 to vary the gain slope of circuit 4 substantially as above described. Comparing FIG. 8 with FIGS. 2 and 3, many similarities become apparent. The single control voltage Vc1 is presented to the control or gate lead 56 of FET 26 via resistance 70, and also to the source or output lead 68 of FET 28 via resistance 100. The control or gate lead 64 of FET 28 is not connected to a second variable control voltage as in FIGS. 2 and 3 but is instead connected through a resistance 72 to a reference Vg that is preferably signal ground. Resistances 70, 72, 100 are preferably each about 3 KΩ.

DC blocking capacitors 102, 104 are connected in series with the input of first matching network 16 and with the output of the second matching network 24. Capacitors 102, 104 prevent any DC present on the RF input or RF output signals from reaching the circuit input or output port 14, 18 where the DC could interfere with proper conductance control of FET 28. Additional DC blocking capacitors 106, 108 are connected between T-node 34 and output lead 60 of FET 26, and between signal ground and lead 76 of the first frequency dependent resonator member 36. A reference voltage Vp (preferably equal to the absolute value of the pinch-off voltage of the FETs, typically about +3 V) is provided at reference voltage port 110 via a resistance 112 to the junction of capacitor 108 and lead 76 of resonator member 36. Capacitor 106 isolates FET 26 from any DC present at the T-node 34, while capacitor 108 isolates reference voltage Vp from signal ground. Capacitors 102, 104, 106, 108 are each preferably about 10 pF, and resistance 112 is about 150Ω. Because the circuit of FIG. 8 includes blocking capacitors 102, 104, 106, 108, the circuit is incapable of operating down to DC, and instead operates between about 2 GHz and about 18 GHZ. Increasing the magnitude of the capacitors, especially capacitors 102, 104, will lower the lowest frequency over which the circuit of FIG. 8 will operate.

The circuit of FIG. 8 is somewhat unusual in that the control voltage Vc1 is applied to the gate 56 of FET 26 and to the source 68 of FET 28. It is more conventional for circuits to vary FET conductance by varying the voltage at the FET gate, thereby varying the gate-source potential. Applicant's aforesaid co-pending application describes a biasing configuration somewhat similar to that of FIG. 8 in conjunction with a different circuit.

With reference to FIG. 8, if Vc1≈+Vp, FET 26 is turned on because its gate 56 and source 58 are at the same potential. At the same time, however, FET 28 is pinched off because its source 68 is connected via resistance 100 to Vc1 (or +Vp) and its gate 64 is grounded via resistance 72. As described earlier in connection with FIG. 3, the first resonator member 36 will now shunt to signal ground signals at node 34 whose frequency is substantially less than $f_h$, while resonator members 38 and 40 will attenuate signals at port 14 whose frequency is substantially less than $f_h$.

Let Vc1 now be 0V. FET 26 is now turned off because its source 58 is more positive than its gate 56, and as a result resonator member 36 is essentially no longer in the circuit and no longer introduces increasing attenuation at lower frequencies. At the same time, FET 28 is turned on because its gate 64 and source 68 are both at the same potential, 0V. Because FET 28 is on, it shunts signals at the input port 14 to the output port 18 without substantial frequency dependent attenuation from resonator members 38 and/or 40. At intermediate levels of control voltage $0 \leq Vc1 \leq Vp$, intermediate levels of gain slope are provided. Subject to the restriction that the lowest frequency of interest will be about 2 GHz rather than 0 GHz, the characteristics of the circuit of FIG. 8 will be substantially the same as the characteristics of the circuit of FIG. 3, as shown by FIGS. 5-7. In FIGS. 3 and 8, FETs 26, 28 each have a gate width of about 150$\mu$ and a gate length of about 0.5$\mu$.

Modifications and variations may be made to the disclosed embodiment without departing from the scope of the invention as defined by the following claims. For example, active variable conductance devices other than FETs may be used, providing the same or equivalent device performance is available over the frequency range of interest. If the system input and/or output load impedances sufficiently match the input or output impedance of the circuit, then the first and/or second matching networks may be dispensed with. Other configurations for the resonator members may be utilized.

What is claimed is:

1. On a MMIC, a circuit for controlling substantially linearly the attenuation-versus-frequency slope characteristic of an RF microwave signal, the circuit comprising:
   a circuit input port, having an input impedance, for receiving the RF microwave input signal from a signal source having a source impedance: the input signal having a frequency range between about DC and an uppermost frequency of about 18 GHz;
   a circuit output port, having an output impedance, for supplying an attenuation fraction of the RF microwave input signal to a load having a load input impedance;
   first and second control ports for receiving respectively first and second control signals whose amplitude varies the attenuation fraction of the RF microwave input signal reaching the circuit output port;
   first and second attenuator elements connected together in series between the circuit input port and the circuit output port, the series connection of said attenuator elements defining a T-node;
   a first frequency dependent resonator member having a first resonant frequency substantially equal to the uppermost frequency, said member having first and second leads wherein the second lead is grounded, for shunting to ground as a function of frequency a signal at the first lead whose frequency is less than the first resonant frequency;
   a second frequency dependent resonator member having a second resonant frequency substantially equal to the uppermost frequency, connected in series with the RF circuit input port and the RF circuit output port, for shunting as a function of frequency to the RF circuit output port a signal at the RF circuit input port whose frequency is about the second resonant frequency and for attenuating as a function of frequency such signal when the signal frequency is less than the second resonant frequency;
   symmetrical means, connected in shunt between the input and output ports and in series between the first lead of the first member and the T-node, and adapted to receive the first and second control signals, controllably connecting the first frequency dependent resonator member between the T-node and ground while simultaneously controllably shunting the second frequency dependent resonator member as a function of the first and second control signals, for causing the attenuation between the RF circuit input port and the RF circuit output port to vary substantially linearly as a function of frequency over a frequency range of DC to about 18 GHz, the attenuation being controlled by said symmetrical means and said control signals;
   said symmetrical means, said first and second attenuator elements and said first and second frequency dependent resonator members including parasitics such that the circuit produces an attenuation at an uppermost frequency of interest that is substantially independent of the control signals;
   the simultaneous controllably connecting and controllably shunting by said symmetrical means causing the input and output impedance of the circuit to remain substantially constant over said frequency range.

2. The circuit of claim 1, wherein said symmetrical means includes:
   a first depletion mode Schottky gate FET having a first output lead coupled to said T-node, a second output lead coupled to the first lead of the first frequency dependent resonator member, and a control lead D.C. coupled directly to the first control port for receiving the first control signal, said first FET controllably connecting the first frequency dependent resonator member between said T-node and ground in response to the first control signal; and
   a second depletion mode Schottky gate FET having a first output lead coupled to the circuit input port, a second output lead coupled to the circuit output port, and a control lead D.C. coupled directly to the second control port for receiving the second control signal, said second FET controllably shunting the second frequency dependent resonant member in response to the second control signal;
   said first and second FETs having substantially similar characteristics;
   said first and second control signals being in push-pull relationship.

3. The circuit of claim 1, wherein each said frequency dependent resonator member has an impedance characterized by at least two poles.

4. The circuit of claim 1, wherein the first and second attenuator elements are substantially frequency independent.

5. The circuit of claim 1, wherein the first and second attenuator elements are substantially equal resistances.

6. On a MMIC, a circuit for controlling substantially linearly the attenuation-versus-frequency slope characteristic of an RF microwave signal, the circuit comprising:

a circuit input port, having an input impedance, for receiving the RF microwave input signal from a signal source having a source impedance the input signal having a frequency range between about DC and an uppermost frequency of about 18 GHz;

a circuit output port, having an output impedance, for supplying an attenuation fraction of the RF microwave input signal to a load having a load input impedance;

a first control port for receiving a first control signal;

a second control port for receiving a second control signal, the second control signal being in push-pull relationship to the first control signal;

a first frequency dependent resonator member having a first resonant frequency substantially equal to the uppermost frequency, said member having first and second leads wherein the second lead is grounded, for shunting to ground as a function of frequency a signal at the first lead whose frequency is less than the first resonant frequency;

first and second attenuator elements connected together in series between the circuit input port and the circuit output port, the series connection of said attenuator elements defining a T-node;

a first active variable conductance device, having a first output lead coupled to said T-node, a second output lead coupled to the first lead of the first resonator member, and a control lead D.C. coupled directly to the first control port for receiving the first control signal, said first device controllably connecting the first frequency dependent resonator member between said T-node and ground in response to the first control signal;

a second active variable conductance device, having a first output lead coupled to the circuit input port, a second output lead coupled to the circuit output port, and a control lead D.C. coupled directly to the second control port for receiving the second control signal, said second device controllably shunting a signal from the RF circuit input port to the RF circuit output port in response to the second control signal;

said first and second devices having substantially similar characteristics;

the conductance of the first and second active variable conductance devices being variable in response to the magnitude of the first and second control signals, respectively;

a second frequency dependent resonator member having a second resonant frequency substantially equal to the uppermost frequency, connected in series with the RF circuit input port and the RF circuit output port, for shunting as a function of frequency to the RF circuit output port a signal at the RF circuit input port whose frequency is about the second resonant frequency and attenuating such signal when the signal frequency is less than the second resonant frequency;

the amplitude of the first and second control signals causing the conductance of the first and second active devices to vary simultaneously such that the first frequency dependent resonator member is controllably connected between the T-node and ground while the second frequency dependent resonator member is simultaneously controllably shunted such that the attenuation-versus-frequency slope characteristic of the circuit varies substantially linearly in response to the magnitude of the first and second control signals as a function of frequency over a frequency range of DC to about 18 GHz;

said first and second active devices, said first and second attenuator elements and said first and second frequency dependent resonator members including parasitics such that the circuit produces an attenuation at an uppermost frequency of interest that is substantially independent of the control signals;

the simultaneous controllably connecting and controllably shunting by said first and second active devices causing the input and output impedance of the circuit to remain substantially constant over said frequency range.

7. The circuit of claim 6, further including a third frequency dependent resonant member connected in series with the second frequency dependent resonant member, said third frequency dependent resonant member having a third resonant frequency about equal to the uppermost frequency.

8. The circuit of claim 6, wherein each active variable conductance device is a depletion mode Schottky gate FET.

9. The circuit of claim 6, wherein each said frequency dependent resonant member has an impedance characterized by at least two poles.

10. The circuit of claim 6, wherein each attenuator element is substantially frequency independent and is a substantially equal resistance.

11. The circuit of claim 6, wherein the first frequency dependent resonator member includes a quarter-wavelength transmission line equivalent to a desired parallel capacitance and inductance.

12. The circuit of claim 6, wherein the resonant frequency of the first and second frequency dependent resonator members is slightly different, the difference being selected to produce a desired skewing of a transfer function of the circuit.

13. The circuit of claim 6, wherein the input impedance is about equal to the source impedance and wherein the output impedance is about equal to the load input impedance.

14. The circuit of claim 6, further including means for matching the input impedance to the source impedance.

15. The circuit of claim 6, further including means for matching the output impedance to the load input impedance.

16. On a MMIC, a circuit for controlling substantially linearly the attenuation-versus-frequency slope characteristic of an RF microwave signal, the circuit comprising:

a circuit input port, having an input impedance, for receiving the RF microwave input signal from a signal source having a source impedance; the input signal having a frequency range between about DC and an uppermost frequency of about 18 GHz;

a circuit output port, having an output impedance, for supplying an attenuation fraction of the RF microwave input signal to a load having a load input impedance;

a control port for receiving a first control signal;

means connected with said control port for generating a second control signal in push-pull relationship to the first control signal;

a first frequency dependent resonator member having a first resonant frequency substantially equal to the uppermost frequency, said member having first and second leads wherein the second lead is grounded, for shunting to ground as a function of frequency a signal at the first lead whose frequency is less than the first resonant frequency;

first and second attenuator elements connected together in series between the circuit input port and the circuit output port, the series connection of said attenuator elements defining a T-node;

a first active variable conductance device, having a first output lead coupled to said T-node, a second output lead coupled to the first lead of the first resonator member, and a control lead D.C. coupled directly to the first control port for receiving the first control signal, said first device controllably connecting the first frequency dependent resonator member between said T-node and ground in response to the first control signal;

a second active variable conductance device, having a first output lead coupled to the circuit input port, a second output lead coupled to the circuit output port, and a control lead D.C. coupled directly to said means for receiving the second control signal, said second device controllably shunting a signal from the RF circuit input port to the RF circuit output port in response to the second control signal;

said first and second devices having substantially similar characteristics;

said first and second active variable conductance devices, said first and second attenuator elements and said first and second frequency dependent resonator members including parasitics such that the circuit produces an attenuation at an uppermost frequency of interest that is substantially independent of the control signals;

the conductance of the first and second active variable conductance devices being variable in response to the magnitude of the first and second control signals, respectively;

a second frequency dependent resonator member having a second resonant frequency substantially equal to the uppermost frequency, connected in series with the RF circuit input port and the RF circuit output port, for shunting as a function of frequency to the RF circuit output port a signal at the RF circuit input port whose frequency is about the second resonant frequency and attenuating such signal when the signal frequency is less than the second resonant frequency;

the amplitude of the first and second control signals causing the conductance of the first and second active devices to vary simultaneously such that the first frequency dependent resonator member is controllably connected between the T-node and ground while simultaneously the second frequency dependent resonator member is controllably shunted such that the attenuation-versus-frequency slope characteristic of the circuit varies substantially linearly in response to the magnitude of the first and second control signals as a function of frequency over a frequency range of DC to about 18 GHz;

the simultaneous controllably connecting and controllably shunting by said first and second active devices causing the input and output impedance of the circuit to remain substantially constant over said frequency range.

17. A microwave system, comprising:

a microwave amplifier having an amplifier output impedance, capable of amplifying and providing as an amplifier output RF microwave signals having a frequency range of about DC to 18 GHz;

a circuit on a microstripline MMIC for receiving as an RF microwave input signal the amplifier output and attenuating the amplifier output as a function of frequency and as a function for first and second control signals, the circuit comprising:

a circuit input port, having an input impedance, for receiving as an RF microwave input signal the amplifier output RF microwave signals; the input signal having a frequency range between about DC and an uppermost frequency of about 18 GHz;

a circuit output port, having an output impedance, for supplying an attenuation fraction of the RF microwave input signal to a load having a load input impedance;

first and second control ports for receiving respectively first and second control signals whose amplitude varies the attenuation fraction of the RF microwave input signal reaching the circuit output port;

first and second attenuator elements connected together in series between the circuit input port and the circuit output port, the series connection of said attenuator elements defining a T-node;

a first frequency dependent resonator member having a first resonant frequency substantially equal to the uppermost frequency, said member having first and second leads wherein the second lead is grounded, for shunting to ground as a function of frequency a signal at the first lead whose frequency is less than the first resonant frequency;

a second frequency dependent resonator member having a second resonant frequency substantially equal to the uppermost frequency connected in series with the RF circuit input port and the RF circuit output port for shunting as a function of frequency to the RF circuit output port a signal at the RF circuit input port whose frequency is about the second frequency and attenuating such signal when the signal frequency is less than the second resonant frequency;

symmetrical means, connected in shunt between the input and output ports and in series between the first lead of the first member and the T-node, and adapted to receive the first and second control signals, controllably connecting the first frequency dependent resonator member between the T-node and ground while simultaneously controllably shunting the second frequency dependent resonator member as a function of the first and second control signals, for causing the attenuation between the RF circuit input port and the RF circuit output port to vary substantially linearly as a function of frequency over a frequency range of DC to about 18 GHz, the attenuation being controlled by said means and said control signals;

said symmetrical means, said first and second attenuator elements and said first and second frequency dependent resonator members including parasitics such that the circuit produces an attenuation at an uppermost frequency of interest that is substantially independent of the control signals;

the simultaneous controllably connecting and controllably shunting by said symmetrical means causing the input and output impedance of the circuit to remain substantially constant over said frequency range.

18. On a MMIC, a circuit for controlling substantially linearly the attenuation-versus-frequency slope characteristic of an RF microwave signal, the circuit comprising:

an A-C coupled circuit input port, having an input impedance, for receiving the RF microwave input signal from a signal source having a source impedance; the input signal having a frequency range between about 2 GHz and an uppermost frequency of about 18 GHz;

an A-C coupled circuit output port, having an output impedance, for supplying an attenuation fraction of the RF microwave input signal to a load having a load input impedance;

a control port for receiving a control signal whose amplitude varies the attenuation fraction of the RF microwave input signal reaching the circuit output port;

first and second attenuator elements connected together in series between the circuit input port and the circuit output port, the series connection of said attenuator elements defining a T-node;

a first frequency dependent resonator member having a first resonant frequency substantially equal to the uppermost frequency, said member having first and second leads wherein the second lead is A-C coupled to signal ground, for shunting to signal ground as a function of frequency a signal at the first lead whose frequency is less than the first resonant frequency;

a reference port for receiving a reference pinch-off voltage, said reference port connected with said second lead of said first frequency dependent resonator member;

a second frequency dependent resonator member having a second resonant frequency substantially equal to the uppermost frequency, connected in series with the RF circuit input port and the RF circuit output port, for shunting as a function of frequency to the RF circuit output port a signal at the RF circuit input port whose frequency is about the second resonant frequency and attenuating such signal when the signal frequency is less than the second resonant frequency;

symmetrical means, connected in shunt between the input and output ports and in series between the first lead of the first member and the T-node, and adapted to receive the control signal and the reference voltage, controllably connecting the first frequency dependent resonator member between the T-node and signal ground while simultaneously controllably shunting the second frequency dependent resonator member as a function of the control signal, for causing the attenuation between the RF circuit input port and the RF circuit output port to vary substantially linearly as a function of frequency over a frequency range of 2 GHz to about 18 GHz, the attenuation being controlled by said symmetrical means and said control signal;

said symmetrical means, said first and second attenuator elements and said first and second frequency dependent resonator members including parasitics such that the circuit produces an attenuation at an uppermost frequency of interest that is substantially independent of the control signal;

the simultaneous controllably connecting and controllably shunting by said symmetrical means causing the input and output impedance of the circuit to remain substantially constant over said frequency range.

19. The circuit of claim 18, wherein said means includes:

a first Schottky gate FET having a first output lead A-C coupled to said T-node a second output lead coupled to the first lead of the first frequency dependent resonator member, and a control lead D.C. coupled directly to the control port for receiving the control signal, said first FET controllably connecting the first frequency dependent resonator member between said T-node and signal ground in response to the control signal; and a second Schottky gate FET having a first output lead coupled to the circuit input port, a second output lead coupled to the circuit output port and D.C. coupled directly to the control port for receiving the control signal, and a control lead D.C. coupled to signal ground, said second FET controllably shunting the second frequency dependent resonant member in response to the control signal; said first and second FETs having substantially similar characteristics.

20. The circuit of claim 19, wherein the reference voltage is approximately the absolute magnitude of the pinch-off voltage of the first and second FETs.

21. The circuit of claim 18, wherein each said frequency dependent resonator member has an impedance characterized by at least two poles.

22. A microwave system, comprising:

a microwave amplifier having an amplifier output impedance, capable of amplifying and providing as an amplifier output RF microwave signals having a frequency range between about 2 GHz and about 18 GHz;

a circuit on a microstripline MMIC for receiving as an RF microwave input signal the amplifier output and attenuating the amplifier output as a function of frequency and as a function of a control signal, the circuit comprising:

an A-C coupled circuit input port, having an input impedance, for receiving as an RF microwave input signal the amplifier output RF microwave signals; the input signal having a frequency range between about 2 GHz and an uppermost frequency of about 18 GHz;

an A-C coupled circuit output port, having an output impedance, for supplying an attenuation fraction of the RF microwave input signal to a load having a load input impedance;

a control port for receiving a control signal whose amplitude varies the attenuation fraction of the RF microwave input signal reaching the circuit output port;

first and second attenuator elements connected together in series between the circuit input port and the circuit output port, the series connection of said attenuator elements defining a T-node;

a first frequency dependent resonator member having a first resonant frequency substantially equal to the uppermost frequency, said member having first and second leads wherein the second lead is A-C coupled to signal ground for shunting to signal ground as a function of frequency a signal at the first lead whose frequency is less than the first resonant frequency;

a reference port for receiving a reference pinch-off voltage, said reference port connected with said second lead of said first frequency dependent resonator member;

a second frequency dependent resonator member having a second resonant frequency substantially equal to the uppermost frequency, connected in series with the RF circuit input port and the RF circuit output port, for shunting as a function of frequency to the RF circuit output port a signal at the RF circuit input port whose frequency is about the second resonant frequency and attenuating such signal when the signal frequency is less than the second resonant frequency;

symmetrical means, connected in shunt between the input and output ports and in series between the first lead of the first member and the T-node, and adapted to receive the control signal and the reference voltage, controllably connecting the first frequency dependent resonator member between the T-node and signal ground while simultaneously controllably shunting the second frequency dependent resonator member as a function of the control signal, for causing the attenuation between the RF circuit input port and the RF circuit output port to vary substantially linearly as a function of frequency over a frequency range of 2 GHz to about 18 GHz, the attenuation being controlled by said symmetrical means and said control signal;

said symmetrical means, said first and second attenuator elements and said first and second frequency dependent resonator members including parasitics such that the circuit produces an attenuation at an uppermost frequency of interest that is substantially independent of the control signal;

the simultaneous controllably connecting and controllably shunting by said symmetrical means causing the input and output impedance of the circuit to remain substantially constant over said frequency range.

23. The microwave system of claim 22, wherein each frequency dependent resonator member has an impedance characterized by at least two poles.

* * * * *